United States Patent [19]

Sasaki et al.

[11] Patent Number: 4,758,808
[45] Date of Patent: Jul. 19, 1988

[54] IMPEDANCE ELEMENT MOUNTED ON A PC BOARD

[75] Inventors: Yoshinori Sasaki; Toshio Watanabe; Isao Yokoyama, all of Akita, Japan

[73] Assignee: TDK Corporation, Tokyo, Japan

[21] Appl. No.: 65,115

[22] Filed: Jun. 29, 1987

Related U.S. Application Data

[63] Continuation of Ser. No. 641,052, Aug. 15, 1984, abandoned.

[30] Foreign Application Priority Data

Aug. 16, 1983 [JP] Japan .................. 58-148702

[51] Int. Cl.⁴ .................. H05K 1/18; H05K 7/06
[52] U.S. Cl. .................. 333/185; 336/200; 336/232; 361/400
[58] Field of Search .............. 333/185, 181; 336/200, 336/232, 212; 361/400

[56] References Cited

U.S. PATENT DOCUMENTS

| | | | |
|---|---|---|---|
| 2,910,662 | 10/1959 | Rex | 336/200 |
| 3,185,947 | 5/1965 | Freymodsson | 336/200 |
| 3,372,358 | 3/1968 | Roy et al. | 336/200 |
| 3,403,298 | 9/1968 | Richards et al. | 336/212 X |
| 3,765,082 | 10/1973 | Zyetz | 336/200 X |
| 3,808,478 | 4/1974 | Winkler | 333/182 X |
| 3,992,276 | 11/1976 | Powanda et al. | 204/159.19 |
| 3,992,691 | 11/1976 | Molthen | 336/200 |
| 4,004,997 | 1/1977 | Tsukamoto | 252/62.54 X |
| 4,040,925 | 8/1977 | McGinniss | 204/159.23 |
| 4,065,624 | 12/1977 | Prucnol et al. | 522/81 X |
| 4,080,585 | 3/1978 | Molthen | 336/200 |
| 4,117,588 | 10/1978 | Johnson | 336/200 X |
| 4,282,369 | 8/1981 | Lucey | 204/159.23 X |
| 4,310,821 | 1/1982 | Frances | 336/200 |
| 4,333,975 | 8/1985 | Bill | 174/52 PE X |
| 4,489,487 | 12/1984 | Bura | 361/400 X |
| 4,494,100 | 1/1985 | Stengel et al. | 336/200 |

FOREIGN PATENT DOCUMENTS

| | | | |
|---|---|---|---|
| 16984 | 10/1980 | European Pat. Off. | 361/400 |
| 2917388 | 11/1980 | Fed. Rep. of Germany | 336/200 |
| 0061666 | 5/1979 | Japan | 174/52 PE |

*Primary Examiner*—Eugene R. LaRoche
*Assistant Examiner*—Benny Lee
*Attorney, Agent, or Firm*—Wyatt, Gerber, Shoup & Badie

[57] ABSTRACT

An impedance element having a longitudinal current path surrounded by ferromagnetic material is implemented by the combination of a single rectangular ferrite chip, some through holes provided through said chip, through hole conductors plated on surface of said through holes, a pair of terminal conductors plated at ends of said chip, a surface conductive pattern deposited on front and back surfaces of said ferrite chip so that said through hole conductors are connected in series to one another between said terminal conductors, and insulation layers covering said surface conductors and said through hole conductors on both front and back surfaces of said ferrite chip. The present impedance element is small in size with relatively large impedance, and is applicable for instance to a high frequency noise filter.

8 Claims, 4 Drawing Sheets

IMPEDANCE ELEMENT MOUNTED ON A PC BOARD

This application is a continuation of Ser. No. 641,052, filed Aug. 15, 1984, now abandoned.

BACKGROUND OF THE INVENTION

The present invention relates to an impedance element, in particular, relates to such an element which is used as a bead filter or a noise filter.

Conventionally, a bead filter is comprised of a cylindrical ferromagnetic hollow body, and a conductor line passing a hole of said hollow body. That bead filter is used as an inductor in a low frequency area, and as a resistor element in a high frequency area.

The impedance Z of a bead filter is shown by the following equation (1), in which the complex permeability ($\mu = \mu' + j\mu''$) is introduced.

$$Z = (\mu_0 L N^2 / 2\pi) \ln(O_D/I_D)(\omega)\mu'' + j(\mu_0 L N^2 / 2\pi) \ln(O_D/I_D)(\omega)\mu' = R + j \quad (1)$$

where $\mu_0$ is permeability in vacuum ($= 4\pi \times 10^{-7}$ H/m), $\mu'$ is real part of permeability; $\mu''$ is imaginary part of permeability, ln is a natural logarithm, $O_D$, $I_D$ and L are outer diameter, inner diameter, and length of a cylindrical hollow ferromagnetic body, respectively, N is number of turns (N=1 in case of a bead filter), Z is impedance, $\omega$ is angular frequency, R is the real part of the impedance, and X is the imaginary part of the impedance and j is an imaginary unit ($j = \sqrt{-1}$). As apparent from the equation (1), a larger impedance is obtained when an inner diameter is small, and a length and an outer diameter are large.

However, a prior cylindrical structure of a bead filter has the disadvantage that the size of the device for large impedances must be large, and therefore, an impedance for each unit volume can not be large. In another word, in a given volume, it is sometimes difficult to provide a desired impedance.

SUMMARY OF THE INVENTION

It is an object, therefore, of the present invention to overcome the disadvantages and limitations of a prior impedance element by providing a new and improved impedance element.

It is also an object of the present invention to provide an impedance element which is small in size with a relatively large impedance.

The above and other objects are attained by an impedance element comprising a rectangular ferromagnetic insulation chip with at least one through hole, a through hole conductor deposited on the surface(s) of said at least one through hole, a pair of terminal conductors provided at ends of said chip, a surface conductor deposited on front and back surfaces of said chip so that said through hole conductors are coupled with one another in series between said terminal conductors, and insulation layers covering said surface conductors and said through hole conductors on both front and back surfaces of said chip.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figures 1A, 1B:
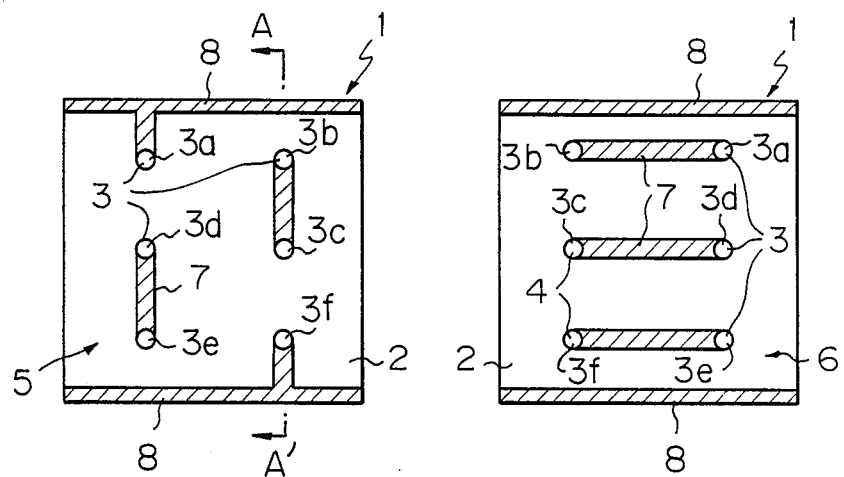
FIG. 1A is a top plane view of the impedance element according to the present invention.
FIG. 1B is a bottom plan view of the impedance element of FIG. 1A.
Figure 1C:
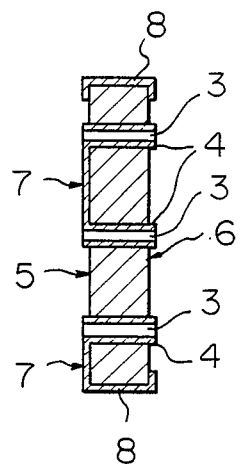
FIG. 1C is a cross section view along the line A—A' of FIG. 1A.

FIGS. 1A through 1C show the embodiment of the present invention, in which FIG. 1A is a top plane view, FIG. 1B is a bottom plan view, and FIG. 1C is a cross section view along the line A—A' of FIG. 1A. The impedance element 1 has a small chip 2 made of ferromagnetic insulation material. Said chip 2 is substantially in rectangular parallelepiped shape, and is preferably made of ferrite material. The chip 2 has six through holes 3 in the thickness direction of the chip. The surface of each through hole is plated with conductive layer 4, and each conductive layer 4 is electrically connected to a surface conductive pattern 7 which is plated on the upper surface and the bottom surface of the chip 2. The ends of the chip 2 are plated also with conductive layer 8, which functions as a terminal of the present impedance element 1 for connection to an external circuit.

Thus, the electrical coupling is provided from the first terminal 8, through the surface conductive pattern 7, the first through hole 3a, the surface pattern, the second through hole 3b, the surface pattern, the third through hole 3c, the surface pattern, the fourth through hole 3d, the surface pattern, the fifth through hole 3e, the surface pattern, the sixth through hole 3f, and the surface pattern, to the second terminal 8.

Figure 2:
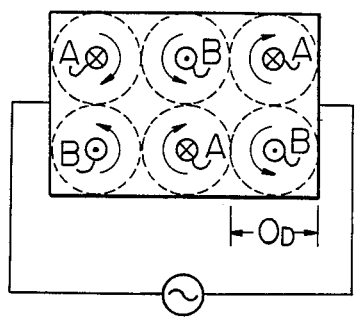
FIG. 2 is an explanatory drawing for brief explanation of operation of an element of FIGS. 1A through 1C.

Therefore, the impedance element has substantially six series connected impedance cells as shown in FIG. 2, in which the symbol A shows the current from the surface of the drawing to the back of the drawing, and the symbol B shows the current from the back of the drawing to the front, and the arrows show the direction of magnetic flux. The direction of the current is opposite to that of the adjacent current, and therefore, no cancellation of the flux occurs. The external diameter $O_D$ in the equation (1) is the length between the two adjacent through holes in case of FIG. 2. The impedance of the element of FIG. 2 is six times of the impedance of each through hole element, and is expressed as follows.

$$Z = 6[(\mu_0 L N^2 / 2\pi) \ln((O_D/I_D)(\omega)\mu'') + j(\mu_0 L N^2 / 2\pi) \ln((O_D/I_D)(\omega)\mu') = (R + jX) \quad (2)$$

The conductive layer 4 in the through holes 3, the surface pattern 7, and the terminals 8 are provided by a plating process, or a baking process of the chip which is drawn with conductive paste.

Figure 3:
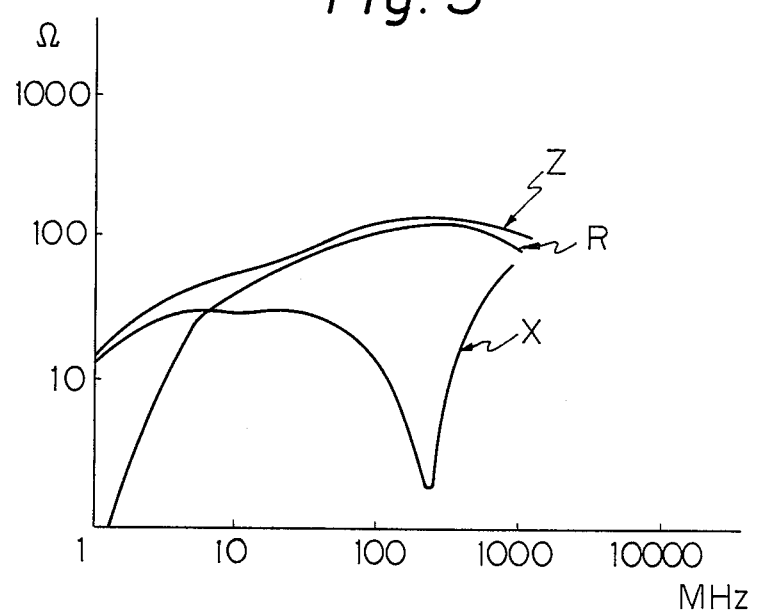
FIG. 3 shows the experimental curves of the present impedance element which has six through holes.

FIG. 3 shows the experimental curves, in which the horizontal axis shows the frequency in MHz, and the vertical axis shows the impedance in ohms. The sample element for the experiment of FIG. 3 has the ferrite chip with $\mu'=220$ and $\mu''=300$ at 10 MHz, with thickness (L) of 1.5 mm. The six through holes with the substantial outer diameter $O_D=1.6$ mm, and the inner diameter $I_D=0.4$ mm. Since the theoretical calculation shows that the impedance at 10 MHz is 60 ohms, the experimental curves coincide with the theoretical calculation.

It should be appreciated in FIG. 3 that the impedance of the present element is low at low frequency, and is high at high frequency. Therefore, one application of the present impedance element is a noise filter for a high frequency component, for instance, it is used as a noise filter at an output of a television tuner circuit.

Figure 4:
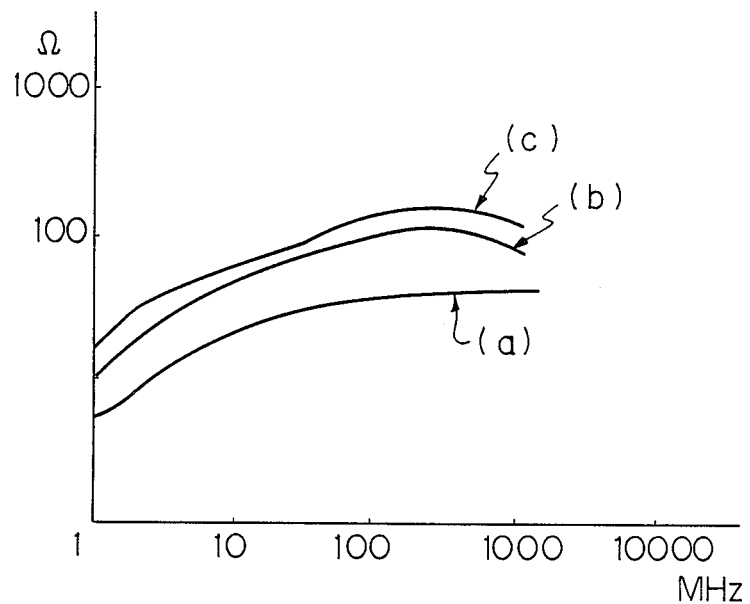
FIG. 4 shows other experimental curves of the impedance element according to the present invention.

FIG. 4 shows other experimental curves which vary the thickness (L) of the chip in the experiment of FIG. 3. The curve (a) of FIG. 4 shows the case of the thickness $L=0.5$ mm, the curve (b) shows the case of the thickness $L=1.0$ mm, and the curve (c) shows the case of $L=1.5$ mm. Those curves coincide also with the theoretical calculation.

Figure 5A:
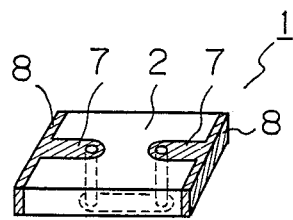
FIGS. 5A and 5B show a structure of the modification of the impedance element according to the present invention.
Figure 5B:
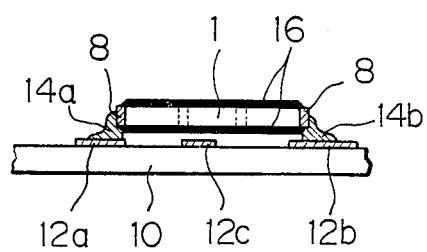

FIGS. 5A and 5B show the modification of the present impedance element, and the feature of that modification is the presence of the insulation film on the surface of the chip. The embodiment of FIGS. 5A and 5B show the case which has two through holes, however, it should be appreciated of course that the feature of FIGS. 5A and 5B is applicable to the embodiment of FIGS. 1A through 1C. In FIGS. 5A and 5B, the numeral 1 is the present impedance element, 8 is the terminals attached at both the ends of the impedance element 1, 16 is the insulation film attached on the surfaces of the element 1, 10 is a printed circuit board on which the present impedance element 1 is fixed, 12a, 12b and 12c are conductive patterns deposited on the printed circuit board 10, and 14a and 14b are solders for fixing the impedance element 1 on the printed circuit board 10. In the embodiment of FIG. 5B, it should be noted that the impedance element 1 is connected between the conductive patterns 12a and 12b.

When there were no insulation film 16 on the impedance element 1, the conductive member on the element 1, like through hole conductor 3 and/or the conductive pattern 7 would be short-circuited with the conductive pattern 12c on the printed circuit board 10. The insulation film 16 painted on the impedance element 1 prevents that short circuited contact. The insulation film 16 is provided on the whole surfaces which have through hole conductors 4 and conductive patterns 7, leaving the portion of the terminals 8 not covered by the insulation film.

Figure 6A:
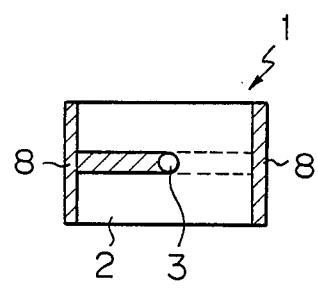
FIGS. 6A through 6D show the structures of the alternatives of the present impedance element.
Figure 6B:
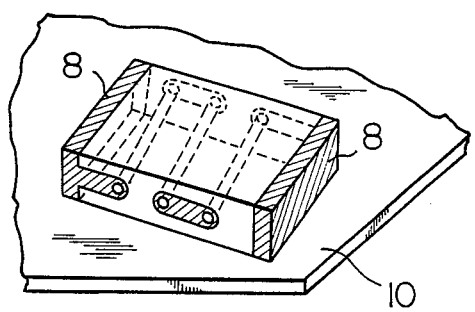
Figure 6C:
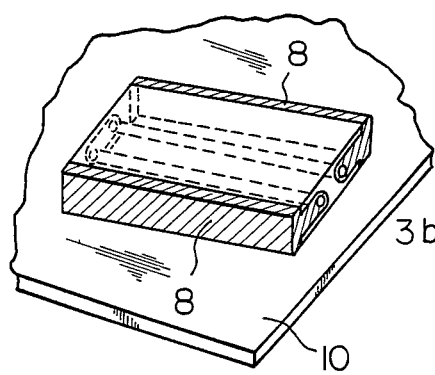

FIGS. 6A through 6D show some alternatives of the present impedance element. FIG. 6A shows the impedance element which has a single through hole, while the embodiment of FIGS. 1A through 1C has 6 through holes. FIG. 6B shows the embodiment that the through holes are provided in the width direction of a chip, while the embodiment of FIGS. 1A through 1C has the through holes in the thickness direction of a chip. FIG. 6C shows the embodiment that the through holes are provided in the longitudinal direction of a chip. The embodiments of FIGS. 6B and 6C have the feature that the substantial length of a bead filter is longer than that of the embodiment of FIGS. 1A through 1C, since the through holes are in the width direction or in the longitudinal direction, instead of the thickness direction.

Figure 6D:
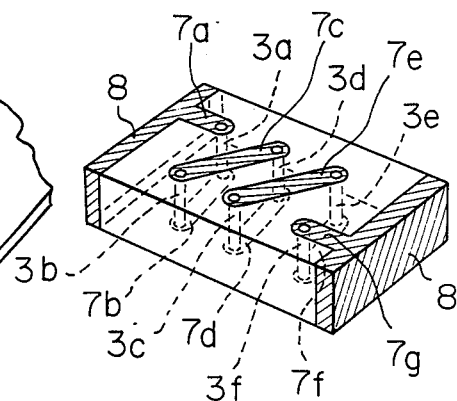

FIG. 6D is still another alternative, in which six through holes are provided in the thickness direction. The feature of the embodiment of FIG. 6D is the current path forming in effect a coil through the pattern 7a, the through hole 3a, the pattern 7b, the through hole 3b, the pattern 7c, the through hole 3d, the pattern 7d, the through hole 3c, the pattern 7e, the through hole 3e, the pattern 7f, the through hole 3f, and the pattern 7g. That current path is substantially equivalent to a coil with three turns, while the current path of the embodiment of FIGS. 1A through 1C does not provide a winding. Because of the winding structure, the embodiment of FIG. 6D provides larger inductance and/or larger impedance as compared with that of the embodiment of FIGS. 1A through 1C.

Next, the manufacturing process of the present impedance element is described. First ferrite material (Mn—Zn ferrite, Mn—Mg—Cu—Zn ferrite, or Ni—Zn ferrite) is shaped to a rectangular parallelepiped shape which has some through holes formed by a press process, then the shaped chips are sintered at about 1200° C. The process for producing the above ferrite chip is similar to the process for producing a conventional cylindrical core memory chip. A silver paste is painted in the through holes, as surface patterns, and as terminals. The surface of the through holes are painted through as a vacuum suction process. The painted chip is heated at about 800° C., then, a thin silver layer is provided. However, electrical resistance of that silver layer is rather large because the silver layer is too thin. Therefore, Cu, Ni, and Sn (tin) are plated through an electroplating process. Sn is plated for the easy soldering, Ni is plated for reducing resistance, and Cu is plated so that affinity between Ag and Ni is improved.

Finally, the insulation layer is painted through silk screen process by about 100μ thickness. The insulation paint is preferably UV (ultra-violet) epoxy resin which is hardened by the illumination with UV beam. A thermosetting resin is not preferable in the present invention since it flows into through holes, and small pin holes might be provided on through holes.

Preferably, iron oxide is mixed with said insulation coating material by 10-15 weight %. The inclusion of iron oxide has two effects, they are, it provides colored (brown) insulation layer, and also it provides some magnetic shielding effect.

According to the preferably embodiments, the size of a chip is $2.0 \times 1.2 \times 1.5$ mm with a single through hole, $3.2 \times 1.6 \times 1.5$ mm with two through holes, $3.2 \times 2.5 \times 1.5$ mm with 4 through holes, or $4.5 \times 3.2 \times 1.5$ mm with 6 through holes. The diameter of a through hole is preferably larger then 0.01 mm, and still preferably, it is 0.4 mm. Of course, the through hole conductors are connected in series to one another.

As described above in detail, according to the present invention, an impedance element which has large impedance and small size has been found. Since it has no lead wire, it is suitable for automatic mounting on a printed circuit board. Further, the present invention provides an impedance element with large Q, since the resistance of the element can be reduced by thick plating of conductive layers. According to our experiment, the resistance between terminals in case of two through holes element is only 30 mili-ohms.

From the foregoing, it will now be apparent that a new and improved impedance element has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. An impedance element soldered to a printed circuit board having a surface, the impedance element comprising:

an essentially rectangular parallelepiped ferromagnetic chip having three pairs of surfaces, the first pair defining the thickness of the element therebetween and comprising a top side and an opposite bottom side facing said printed board, the second and third pair comprising respectively sides perpendicular to said printed circuit board surface; wherein the thickness is less than the distance between the opposite sides of said second pair;

at least one conductive and inductive through hole extending between the opposed surfaces of said second pair of surfaces;

a through hole conductor deposited on the surface of each through hole between said second pair of surfaces;

a pair of terminal conductors deposited over the whole area of said third pair of opposed surfaces, said terminal conductors being soldered to said circuit board;

surface conductors deposited on said second pair of opposed surfaces to connect said hole conductors in series with said terminal conductors; and an insulation layer of ultraviolet setting resin including 10-15% weight of iron oxide covering said surface conductors;

wherein said terminal conductors and said surface conductors are deposited on the surfaces perpendicular to the printed circuit board and the surfaces of said terminal conductors and bottom side are free of the insulation layer.

2. An impedance element according to claim 1, wherein there is at least one additional through hole forming a plurality of said through holes, said surface conductors are coupled together with said through hole conductors so that said surface conductors and hole conductors provide a coil.

3. An impedance element according to claim 1, wherein each through hole is circular and of diameter larger than 0.1 mm.

4. An impedance element according to claim 1 wherein said ultra-violet setting resin is silk-screened onto the surface conductors.

5. An impedance element soldered to a printed circuit board having a surface, the impedance element comprising:

an essential rectangular parallelepiped ferromagnetic chip having three pairs of surfaces, the first pair defining the thickness of the element therebetween and comprising a top side and an opposite bottom side which are parallel to the circuit board surface and with the bottom side facing said printed board, the second and third pair comprising respectively sides perpendicular to said printed circuit board surface; wherein the thickness is less than the distance between the opposite sides of said second pair;

at least one conductive and inductive through hole extending between the opposed surfaces of said second pair of surfaces;

a through hole conductor deposited on the surface of each through hole between said second pair of surfaces;

a pair of terminal conductors deposited over the whole area of said third pair opposed surfaces, said terminal conductors being soldered to said circuit board;

surface conductors deposited on said second pair of opposed surfaces to connect said hole conductors in series with said terminal conductors; and an insulation layer of ultraviolet setting resin covering said surface conductors;

wherein said terminal conductors and said surface conductors are deposited on the surfaces perpendicular to the printed circuit board and the surfaces of said terminal conductors and bottom side are free of the insulation layer; and wherein said through hole conductor and said surface conductor are plated layers comprising in order Ag, Cu, Ni and Sn.

6. An impedance element according to claim 5, wherein there is at least one additional through hole forming a plurality of said through holes, said surface conductors are coupled together with said through hole conductors so that said surface conductors and hole conductors provide a coil.

7. An impedance element according to claim 5, wherein each through hole is circular and of a diameter larger than 0.1 mm.

8. An impedance element according to claim 5 wherein said ultra-violet setting resin is silk-screened onto the surface conductors.

* * * * *